(12) United States Patent
Tipley

(10) Patent No.: US 8,270,155 B2
(45) Date of Patent: Sep. 18, 2012

(54) COOLANT PULSING FOR COMPUTER SYSTEM

(75) Inventor: Roger E. Tipley, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 114 days.

(21) Appl. No.: 12/866,858

(22) PCT Filed: Feb. 15, 2008

(86) PCT No.: PCT/US2008/054054
§ 371 (c)(1),
(2), (4) Date: Aug. 9, 2010

(87) PCT Pub. No.: WO2009/102335
PCT Pub. Date: Aug. 20, 2009

(65) Prior Publication Data
US 2010/0315770 A1    Dec. 16, 2010

(51) Int. Cl.
*H05K 7/20* (2006.01)
(52) U.S. Cl. .................. 361/679.47; 361/690; 361/694; 361/695; 165/104.33; 165/121; 165/122; 165/185; 62/259.2
(58) Field of Classification Search ............ 361/679.46–679.54, 688, 689–697, 361/715–727; 165/80.2–80.5, 104.33, 104.34, 165/119–126, 185, 97, 247, 109.1, 215; 454/184; 62/186, 259.2; 318/40, 400.37, 471
See application file for complete search history.

(56) References Cited

U.S. PATENT DOCUMENTS

| | | | |
|---|---|---|---|
| 4,270,694 A | 6/1981 | Knauth | |
| 5,190,099 A * | 3/1993 | Mon | 165/104.33 |
| 5,263,537 A * | 11/1993 | Plucinski et al. | 165/97 |
| 5,794,450 A * | 8/1998 | Alexander | 62/6 |
| 5,863,246 A * | 1/1999 | Bujak, Jr. | 454/255 |
| 6,219,234 B1 * | 4/2001 | Sammakia et al. | 361/695 |
| 6,751,094 B2 * | 6/2004 | Kolb et al. | 361/679.33 |
| 7,075,788 B2 * | 7/2006 | Larson et al. | 361/695 |
| 7,233,493 B2 * | 6/2007 | Wang et al. | 361/695 |
| 7,450,381 B2 * | 11/2008 | Gilliland et al. | 361/695 |
| 7,554,803 B2 * | 6/2009 | Artman et al. | 361/695 |
| 7,869,209 B2 * | 1/2011 | Nemoz et al. | 361/690 |
| 8,035,970 B2 * | 10/2011 | Schott | 361/695 |
| 8,051,671 B2 * | 11/2011 | Vinson et al. | 62/259.2 |
| 8,061,155 B2 * | 11/2011 | Farquhar et al. | 62/259.2 |
| 2003/0147214 A1 | 8/2003 | Patel | |
| 2004/0007001 A1 * | 1/2004 | Demster | 62/157 |
| 2005/0168941 A1 | 8/2005 | Sokol et al. | |
| 2005/0168942 A1 * | 8/2005 | Steinbrecher | 361/690 |
| 2009/0016019 A1 * | 1/2009 | Bandholz et al. | 361/695 |
| 2009/0318071 A1 * | 12/2009 | Nemoz et al. | 454/184 |

FOREIGN PATENT DOCUMENTS

| | | | |
|---|---|---|---|
| JP | 10065372 A | * | 3/1998 |
| KR | 20-0256258 | | 12/2001 |
| KR | 20-0289467 | | 9/2002 |
| KR | 10-2005-008968 | | 1/2005 |
| KR | 10-2005-0019096 | | 2/2005 |

OTHER PUBLICATIONS

International Search Report and Written Opinion dated Oct. 31, 2008, 9 pages.

* cited by examiner

*Primary Examiner* — Michail V Datskovskiy

(57) ABSTRACT

The present invention provides for repeatedly pulsing coolant through a first channel exposed to heat-generating computer components. The pulsing involves a relatively low baseline coolant flow rate with repeated excursions to a relatively high expulsion coolant flow rate.

18 Claims, 2 Drawing Sheets

COOLANT PULSING FOR COMPUTER SYSTEM

BACKGROUND OF THE INVENTION

Computer components, especially microprocessors, can generate considerable heat that must be removed from the computer, least it cause damage to computer components, burn or at least cause discomfort to users, or ignite a fire. Most computers rely on some form of coolant fluid, typically air, to remove heat. Most often, the coolant, is air forced by fans through a computer system. The fans, for the most part, provide a consistent flow of coolant. In some systems, the coolant flow rate can be regulated as a function of the temperature, either internal temperature, or a combination of internal and external temperature. Some systems turn the fans off when the internal temperature is low and speed up a fan as temperature increases.

As widely used as fans are, they are not always sufficiently effective at removing heat. Some systems supplement or replace airflow with liquid heat exchange, but this can be an expensive solution. What is needed is a more-effect yet economical approach to heat removal.

Herein, related art is described to facilitate understanding of the invention. Related art labeled "prior art" is admitted prior art; related art not labeled "prior art" is not admitted prior art.

BRIEF DESCRIPTION OF THE DRAWINGS

The figures depict implementations/embodiments of the invention and not the invention itself.

DETAILED DESCRIPTION

In the course of the present invention, it was recognized that the laminar flow produced by cooling fans can leave dead spots and limit heat absorption. The present invention provides for pulsed coolant flow along a channel through a computer system. In other words, the coolant flow speed alternates between relatively low (or no) speed and relatively high speed. The relatively "calm" sub-periods facilitate heat absorption by the air, while the relatively "windy" sub-periods help reduce dead spots. In the latter case, the high speed, more turbulent, coolant flow can entrain heated fluid that would (in a laminar flow system) be less likely to be exhausted.

Figure 1:
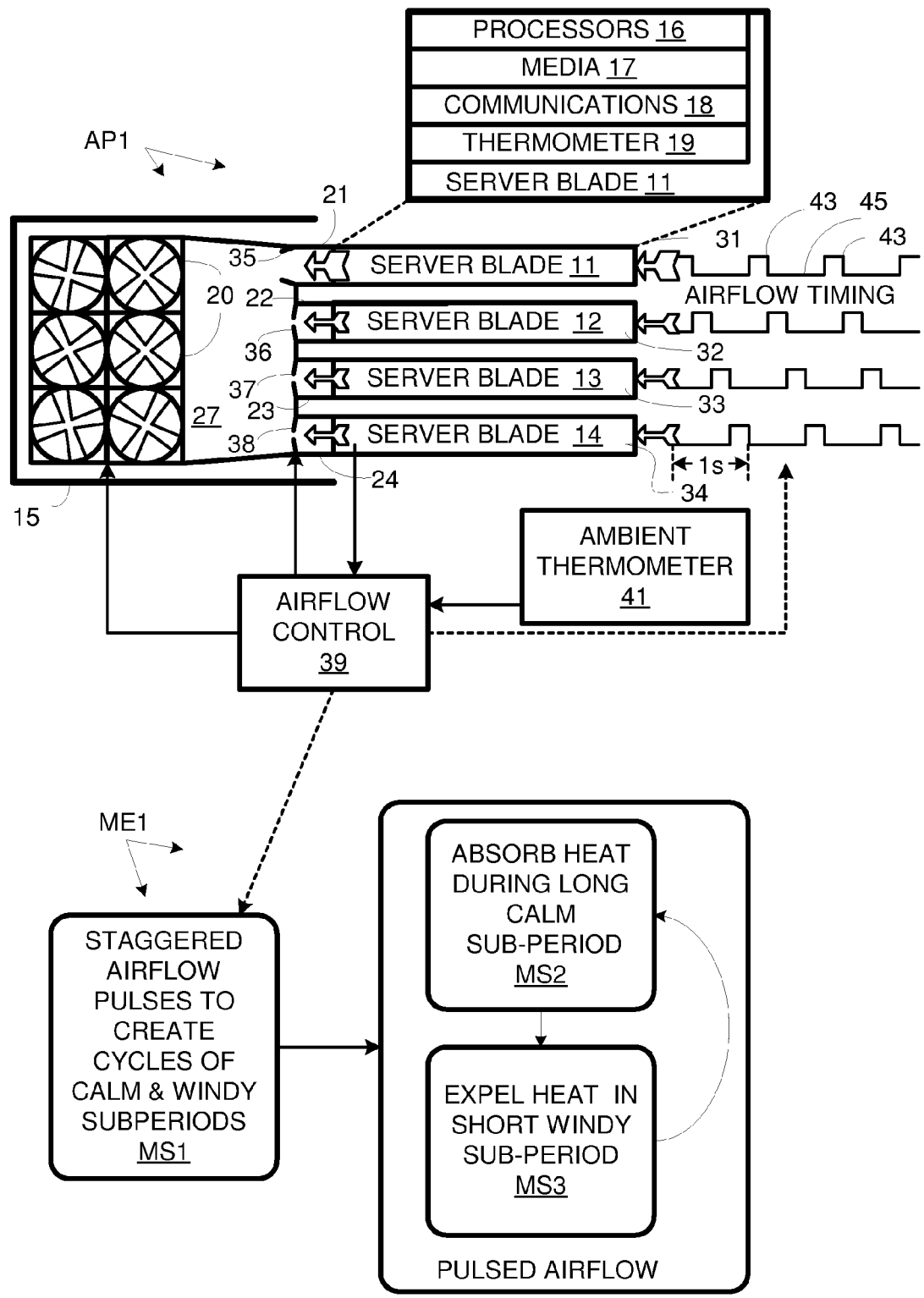
FIG. 1 is a combination of a schematic representation of a blade server system and a flow chart of a heat removal method used with the system in accordance with an embodiment of the invention. Note that in the figures, the fans are drawn orthogonal to their actual orientation.

FIG. 1 depicts a blade-server computer system AP1 in which four blades 11, 12, 13, and 14 are inserted into a chassis 15. Whereas a standard rack-mount server can exist with (at least) a power cord and network cable, blade servers have many components removed for space, power and other considerations while still having all the functional components to be considered a computer. A blade enclosure provides services such as power, cooling, networking, various interconnects and management—though different blade providers have differing principles around what should and should not be included in the blade itself (and sometimes in the enclosure altogether). The present invention provides embodiments for all these variations and for any number of blades, as well as other forms of modular and non-modular computer systems.

Blades 11-14 include processors 16, media 17 (e.g., solid-state and disk-based memory), and communications devices 18 (e.g., I/O devices, network interface cards), all of which generate heat. Power for the blades is provided via chassis 15. Six fans 20, installed in chassis 15, provide for drawing coolant into and exhausting coolant out of blades 11-14. Of course, other numbers of types of fans can be used. Tubes 21-24, couple respective blades 11-14 to a common plenum 27 located adjacent fans 20. Each combination of tube and blade defines a coolant flow channel 31-34 in which flowing coolant can contact computer components 16-18 to remove heat therefrom.

Each tube includes a barn-door valve 35-38 that can be switched from an open position, which minimally restricts coolant flow through the respective channel 31-34, and a closed position, which maximally restricts coolant flow through the respective channel. A coolant flow controller 39 controls valves 35-38 so that they open and close in an alternating staggered pattern, as shown in the timing diagram at the right in FIG. 1. Coolant flow controller 39 can be responsive to internal (to the blades) temperature via thermometers 19 and an ambient temperature via ambient thermometer 41. At cooler temperatures, fans 20 can be shut off and valves 35-38 left open. At moderate temperatures, a constant coolant flow can be provided with valves 35-38 open.

At higher temperatures, the staggered pattern can be used with fans 20 at a relatively high speed. Each channel 31-34 is then subjected to short sub-periods 43 of turbulent windy conditions separated by longer sub-periods 45 of relatively calm laminar flow. During the calm sub-periods 45, there is sufficient opportunity for heat to be absorbed by the coolant; during the windy sub-periods 43, the coolant is whisked away, entraining coolant that was contained in relatively stagnant pockets during the respective preceding calm sub-periods 45.

In general, the windy sub-periods 43 should be shorter than the calm sub-periods, with the ratio being 2:3 or more extreme. In FIG. 1, the ratio is 1:4 so that one valve is closed at all times, but the total coolant flow through channels 31-34 is essentially constant. The amount the total coolant flow varies in volume per unit time is less than the amount the coolant flow varies in each of the channels 31-34. Thus, coolant flow controller 39 can achieve the pulsed flow without changing fan speeds.

Coolant-flow controller 39 can close barn-door valves 35-38 entirely for maximum turbulence or leave them slightly open so that at least a minimal coolant flow exists at all times as long as fans 20 are running. Instead of using valves 35-38, coolant-flow controller 39 can control the speed of fans 20 to pulse all four channels synchronously. Varying fan speed to control coolant flow has the advantage that it works with single as well as multiple channels. Coolant-flow controller 39 can pulse the fan speed and valve positions in various ways and even alternate degrees and types of control so that different turbulence patterns are generated. Thus, if one type of control leaves certain stagnant areas in place, another type of control might be able to entrain the previously stagnant air.

A method ME1 of the invention is flow charted in the lower portion of FIG. 1. At method segment MS1, coolant flow is pulsed to create cycles with calm and windy sub-periods 45 and 43. Typically, the windy sub-periods 43 are on a duty cycle of 40% or less. If there are multiple channels, the windy sub-periods can be the reciprocal of the number of channels. During the relatively long calm sub-periods 45, the relatively slow moving coolant absorbs heat from exposed computer components in the respective channel at method segment MS2. During the relatively short windy sub-periods 43, heat is expelled with the coolant that absorbed it.

The invention provides alternative means for producing pulsed coolant flow. Of course, controlled pumping into the channel intake can be used instead of pulling at the exhaust. Coolant flow can be diverted from a single channel and dumped before entering the channel during calm periods. Another approach is to change the cross section or volume of a channel while maintaining a constant volume per time coolant flow.

Figure 2:
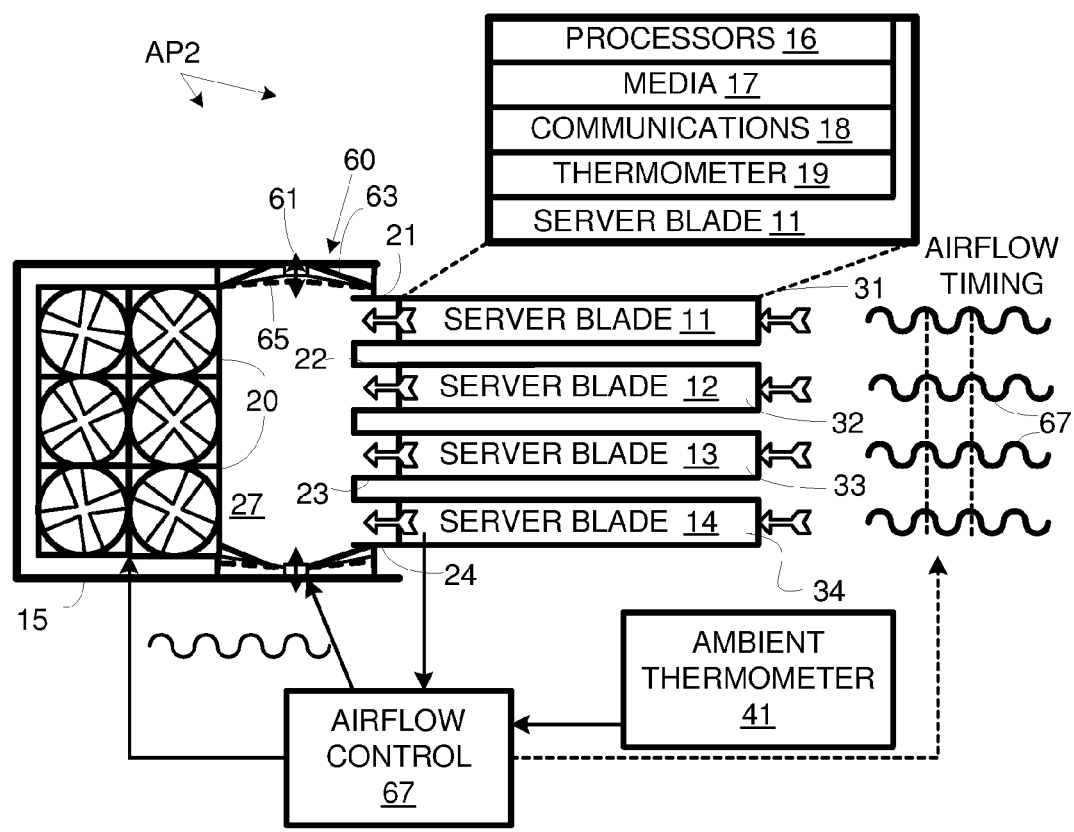
FIG. 2 is a schematic illustration of a single-computer system in accordance with another embodiment of the invention.

In FIG. 2, a computer system AP2 has many components that correspond to parts of computer system AP1, so like components are given the same numbers. System AP2 eschews the valves of system AP1 for opposing baffles 60, which operate in the manner of an audio subwoofer. Each baffle includes a frame 61, a coil 63, and a baffle membrane 65. Airflow controller 67 drives these baffles 60 sinusoidally to vary the pressure in plenum 27. This causes baffle membranes 65 to move in toward each other than out away from each other; this in turn alters the effective volume of plenum 27 periodically, which in turn causes the air pressure in plenum 27 to vary periodically.

When the fan speed is constant, the amount of coolant in volume per time stays constant, so the speed at which coolant flows changes with the channel volume. Airflow controller 67 controls this volume to alternate calm and turbulent sub-cycles within server blades 11-14. This has the effect of allowing heat to be absorbed during calm sub-periods and causing stagnant heated coolant to be entrained for exhaust during turbulent sub-periods. Baffles 60 are driven synchronously so that their motions oppose, minimizing net motions to computer system AP2.

The pulse period or signal frequency can vary according to the topology of the computer system, heat characteristics of components, and ambient conditions. In general, enough calm time should be allotted to permit heat to be absorbed, but not so long that heat builds up unacceptably. Enough time should be allotted to the windy sub-period to allow a full exchange of air or other coolant, but not so much longer so as to not waste opportunity to absorb heat. The higher the baseline flow (e.g., the flow rate during a calm sub-period), the longer the calm sub-period can be without heat buildup. In general, the frequency can be anywhere from 0.01 Hz to 100 Hz. A variety of shapes can be used as can be gleaned from a comparison of FIGS. 1 and 2. Noise from a sinusoidal waveform is easy to filter for purposes of minimizing radio frequency noise.

While the coolant can be air, especially for systems in which the coolant gas is not contained, other fluids can be used, including other gases, liquids, and fluids that change phase as heat is absorbed in the computer system. Heated exhaust air can be dumped to the ambient air surrounding computer system AP1. However, this can heat the ambient air and reduce its ability to cool. The ambient air can be cooled, e.g., using air conditioning or heat exchange so that it retains its cooling effectiveness. Alternatively, air or other coolant gas can be contained in a closed system with heat removed using a heat exchanger external to computer AP2.

In some multi-channel embodiments, such as the embodiment of FIG. 1, the coolant flow through individual channels can vary considerably even though the total coolant flow through the channels collectively remains essentially constant. Of course, some variation in the total flow can still occur. For the most part, however, the amount of variation in the total volume-rate flow can be less than the amount of variation in the volume-rate flows for the individual channels.

The calm period can involve positive coolant flow (in the same direction as the exhaust), negative coolant flow (e.g., intake and exhaust through same port, as in breathing) or zero coolant flow. Zero coolant flow can be achieved by closing intake and/or exhaust openings. Negative coolant flow can be achieved by reversing fan direction, either by changing the direction the fan blades rotate (e.g., clockwise versus counterclockwise) or by rotating the fans 180° so they face in the opposite direction. The invention can apply to various types of blade systems, other types of modular computer systems including rack-mount systems, self-standing computers, etc. These and other modifications to and variations upon the illustrated embodiments are provided for by the present invention, the scope of which is defined by the following claims.

What is claimed is:

1. A method of cooling a computer system comprising:
    repeatedly pulsing coolant through a first channel exposed to heat-generating computer components, said pulsing involves
        a zero or relatively low baseline coolant flow rate with repeated excursions to a relatively high expulsion coolant flow,
        changing a volume of said first channel, and
        moving opposing baffles.

2. A method as recited in claim 1 wherein said baseline coolant flow rate is non-zero.

3. A method as recited in claim 1 wherein said pulsing involves controlling valves between said components and fans in fluidic communication with said first channel.

4. A method as recited in claim 1 wherein said pulsing involves varying the speed of fans in fluidic communication with said channel.

5. A method as recited in claim 1 wherein said excursions occur on a less than 40% duty cycle.

6. A method as recited in claim 1 wherein said excursions occur repeatedly, with an average period between 0.01 and 10 seconds.

7. A method as recited in claim 1 wherein there are plural channels with exposed heat-generating computer components, for each of said channels, said pulsing involving a zero or relatively low baseline coolant flow rate with repeated excursions to a relatively high expulsion coolant flow rate, said pulsing being staggered across channels so that the total coolant flow rate through said channels varies less than the coolant flow through said first channel.

8. A method as recited in claim 1 wherein said computer system includes plural computers, each of said computers including a data processor, memory, and communications devices, each of said computers corresponding to a respective one of said channels.

9. A system comprising:
    structural components defining plural coolant flow channels in contact with heat-generating computer components; and
    means for inducing pulsed coolant flow through said channels on a staggered basis across said channels, the induced pulse coolant flow involves
        a zero or relatively low baseline coolant flow rate with repeated excursions to a relatively high expulsion coolant flow rate,
        changing a volume of said channels, and
        moving opposing baffles.

10. A system as recited in claim 9 wherein the total coolant flow through each of said channels varies more than the total coolant flow through said channels.

11. A system as recited in claim 9 further comprising fans for inducing said coolant flow and valves in respective channels for pulsing said coolant flow.

12. A system as recited in claim 11 wherein said valves switch between relatively open and relatively closed conditions with an average period within an order of magnitude of 3 seconds.

13. A system as recited in claim 12 wherein each of said valves is in a relatively closed condition less than 40% of the time on average.

14. A system as recited in claim 11 wherein more than 60% of the time at least one of said valves is in a relatively open condition.

15. A system as recited in claim 9 wherein said system includes modular computers, each of which defines at least one of said channels.

16. A system as recited in claim 15 wherein each of said modular computers is attached to a common chassis including fans for inducing said coolant flow.

17. A system as recited in claim 14 wherein said valves are barn-door valves.

18. A computer system comprising:
   heat-generating computer components;
   a fluid channel;
   means for causing fluid to flow through said channel so as to remove heat from said heat-generating components; and
   means for repeatedly changing the volume of said fluid channel so as to vary the speed with which fluid flows through said channel, the speed of fluid that flows through said channels is varied on a staggered basis across said channel, the speed involves
   a zero or relatively low baseline speed with repeated excursions to a relatively high expulsion speed,
   changing a volume of said channel, and
   moving opposing baffles.

* * * * *

UNITED STATES PATENT AND TRADEMARK OFFICE
CERTIFICATE OF CORRECTION

PATENT NO. : 8,270,155 B2
APPLICATION NO. : 12/866858
DATED : September 18, 2012
INVENTOR(S) : Roger E. Tipley Page 1 of 1

It is certified that error appears in the above-identified patent and that said Letters Patent is hereby corrected as shown below:

In the Claims:

In column 4, line 24, delete "flow," and insert -- flow rate, --, therefor.

Signed and Sealed this
Twenty-third Day of April, 2013

Teresa Stanek Rea
*Acting Director of the United States Patent and Trademark Office*